(12) United States Patent
He et al.

(10) Patent No.: US 11,069,572 B2
(45) Date of Patent: Jul. 20, 2021

(54) SEMICONDUCTOR DEVICE AND FORMING METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Ze Jun He, Shanghai (CN); Jun Ling Pang, Shanghai (CN)

(73) Assignees: Semiconductor Manufacturing International (Shanghai) Corporation, Shanghai (CN); Semiconductor Manufacturing International (Beijing) Corporation, Beijing (CN)

(*) Notice: Subject to any disclaimer, the term of this patent is extended or adjusted under 35 U.S.C. 154(b) by 0 days.

(21) Appl. No.: 16/806,062

(22) Filed: Mar. 2, 2020

(65) Prior Publication Data

US 2020/0294853 A1 Sep. 17, 2020

(30) Foreign Application Priority Data

Mar. 13, 2019 (CN) .......................... 201910189259.8

(51) Int. Cl.
*H01L 21/768* (2006.01)
*H01L 23/522* (2006.01)
*H01L 21/311* (2006.01)

(52) U.S. Cl.
CPC .. *H01L 21/76897* (2013.01); *H01L 21/31144* (2013.01); *H01L 21/7684* (2013.01); *H01L 21/76805* (2013.01); *H01L 21/76816* (2013.01); *H01L 21/76831* (2013.01); *H01L 21/76877* (2013.01); *H01L 23/5226* (2013.01)

(58) Field of Classification Search
CPC ......... H01L 21/76897; H01L 21/76831; H01L 21/76805; H01L 23/5226; H01L 21/76816; H01L 21/76877; H01L 21/31144; H01L 21/7684
See application file for complete search history.

(56) References Cited

U.S. PATENT DOCUMENTS 9,634,013 B2 * 4/2017 Liaw ................. H01L 29/66545
9,837,539 B1 * 12/2017 Chen ................. H01L 21/32115

* cited by examiner

*Primary Examiner* — Stephen W Smoot
*Assistant Examiner* — Vicki B. Booker
(74) *Attorney, Agent, or Firm* — Anova Law Group, PLLC

(57) ABSTRACT

Semiconductor device and formation method are provided. The method includes providing a substrate, a first fin and a second fin on the substrate, an isolation structure covering a portion of sidewalls of the first and second fins, a gate structure across the first fin or the second fin, a first doped source/drain region in the first fin, a second doped source/drain region in the second fin, and an interlayer dielectric layer on the isolation structure, the first and second fins, and the gate structure. A first through hole is formed in the interlayer dielectric layer, exposing the first doped source/drain region or the second doped source/drain region. A second through hole is formed in the interlayer dielectric layer on the isolation structure to connect to the first through hole. A first plug is formed in the first through hole and a second plug is formed in the second through hole.

20 Claims, 10 Drawing Sheets

SEMICONDUCTOR DEVICE AND FORMING METHOD THEREOF

CROSS-REFERENCES TO RELATED APPLICATIONS

This application claims priority of Chinese Patent Application No. 201910189259.8, filed on Mar. 13, 2019, the entire contents of which are hereby incorporated by reference.

FIELD OF THE DISCLOSURE

The present disclosure generally relates to the field of semiconductor device manufacturing technologies and, more particularly, relates to a semiconductor device and its forming method.

BACKGROUND

As the integration degree of semiconductor devices increases, the critical dimensions of transistors continue to shrink, and the design of three-dimensional structures such as fin field-effect transistor (FinFET) has become a hot spot in the field. A FinFET device is an emerging multi-gate device. The FinFET generally has a plurality of thin fins extending vertically upward from a substrate. The FinFET includes a channel formed in the fin and a gate structure formed on the fin. A source region and a drain region are formed in fin on both sides of the gate structure, and adjacent fins are separated by an isolation structure.

As the device continues to be miniaturized, it is necessary to fabricate smaller and more densely packed fins. Accordingly, a distance between adjacent plugs on a surface of the doped source/drain region and in an extending direction of the gate structure also needs to be reduced. As the size of semiconductor devices continues to shrink, the critical dimensions of photolithography have gradually approached or exceeded the physical limits of photolithography.

Short circuits are easily formed between adjacent plugs when using conventional one-step photolithography process, resulting in poor performance of the formed semiconductor devices. The disclosed device and method are directed to at least partially alleviate one or more problems set forth above and to solve other problems in the art.

BRIEF SUMMARY OF THE DISCLOSURE

One aspect of the present disclosure provides a forming method of a semiconductor device. A first fin and a second fin that are adjacent to each other and arranged in parallel on a substrate. An isolation structure covers a portion of sidewalls of the first and second fins. A gate structure is across the first fin or the second fin. The gate structure covers a portion of the isolation structure. A first doped source/drain region is in the first fin on both sides of the gate structure. A second doped source/drain region is in the second fin on both sides of the gate structure. An interlayer dielectric layer is on the isolation structure, covering tops and sidewalls of the first and second fins, and covering top and sidewalls of the gate structure. A first through hole is formed in the interlayer dielectric layer and exposes the first doped source/drain region or the second doped source/drain region. A second through hole is formed in the interlayer dielectric layer on the isolation structure. The second through hole is connected to the first through hole. A first plug is formed in the first through hole and a second plug is formed in the second through hole, after the first through hole and the second through hole are formed.

Another aspect of the present disclosure provides a semiconductor device. The semiconductor device includes a substrate, a first fin and a second fin adjacent to each other and arranged in parallel on the substrate, an isolation structure covering a portion of sidewalls of the first second fins, a gate structure across the first fin or the second fin, the gate structure covering a portion of the isolation structure, a first doped source/drain region disposed in the first fin on both sides of the gate structure, and a second doped source/drain region disposed in the second fin on both sides of the gate structure, and an interlayer dielectric layer on the isolation structure, covering tops and sidewalls of the first and second fins, and top and sidewalls of the gate structure. A first through hole is in the interlayer dielectric layer, exposing the first doped source/drain region or the second doped source/drain region, and a first plug is in the first through hole. A second through hole is in the interlayer dielectric layer on the isolation structure, and a second plug is in the second through hole. The second plug is connected to the first plug.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
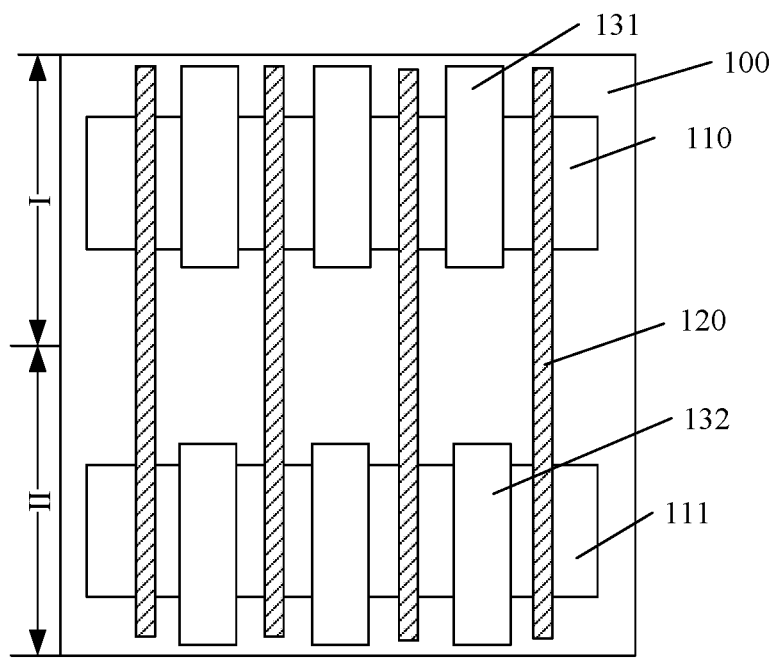
FIG. 1 illustrates a schematic diagram of a semiconductor device.

FIG. 1 illustrates a schematic diagram of a semiconductor device. The semiconductor device includes a substrate 100 having a first region I and a second region II. A fin 110 is on the first region I of the substrate, and a fin 111 is on the second region II of the substrate. A gate structure 120 is across the first fin 110 and the second fin 111, a first doped source/drain region (not shown) is in the first fin 110 on both sides of the gate structure 120, a second doped source/drain region (not shown) is in the second fin 111 on both sides of the gate structure 120, a first plug 131 is on a top surface of the first doped source/drain region, and a second plug 132 is on a top surface of the second doped source/drain region. The first plug 131 and the second plug 132 are separated from each other.

As the size of the semiconductor device is gradually reduced, the spacing between the first plug 131 and the second plug 132 is gradually reduced. Due to the small pitch between plugs, the critical dimensions of photolithography gradually approach or exceed the physical limit of photolithography. Conventional photolithography processes cannot meet the requirements for forming a small pitch between the first plug 131 and the second plug 132.

In one example, in the process of forming the semiconductor device, for forming the first plug 131 and the second plug 132 with a small pitch, forming the first plug 131 and the second plug 132 includes: first forming an initial plug connected to each other through a first mask layer, then forming a second mask layer. The pattern in the second mask layer can form an opening in the initial plug, thereby forming the first plug 131 and the second plug 132 separated from each other.

In the above method, the first plug 131 and the second plug 132 with a small pitch can be formed. However, for breaking the initial plug, it is necessary to form an opening, which increases use of the patterned layers. The process steps and the manufacturing costs increase accordingly.

In another example, in the process of forming the semiconductor device, for forming the first plug 131 and the second plug 132 with a small pitch, forming the first plug 131 and the second plug 132 includes: photolithographically forming the first plug 131 using the first patterned layer in a photolithography, and photolithographically forming a second plug 132 using the second patterned layer.

In the above method, the first plug 131 and the second plug 132 with a small pitch can be formed. However, the first plug 131 and the second plug 132 are formed using two patterned layers and two photolithography processes, thereby increasing use of patterned layers. The process steps and the manufacturing costs increase accordingly.

Figure 18:
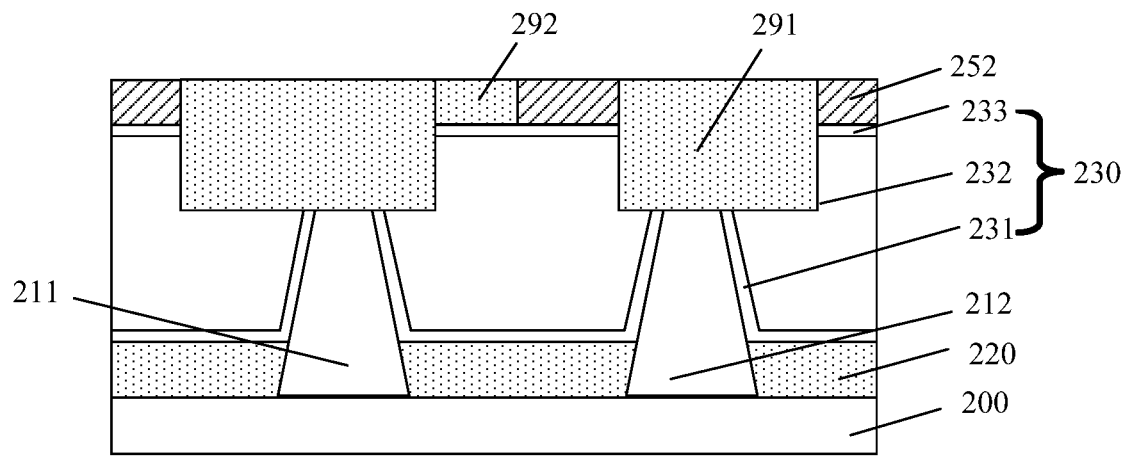
Figure 19:
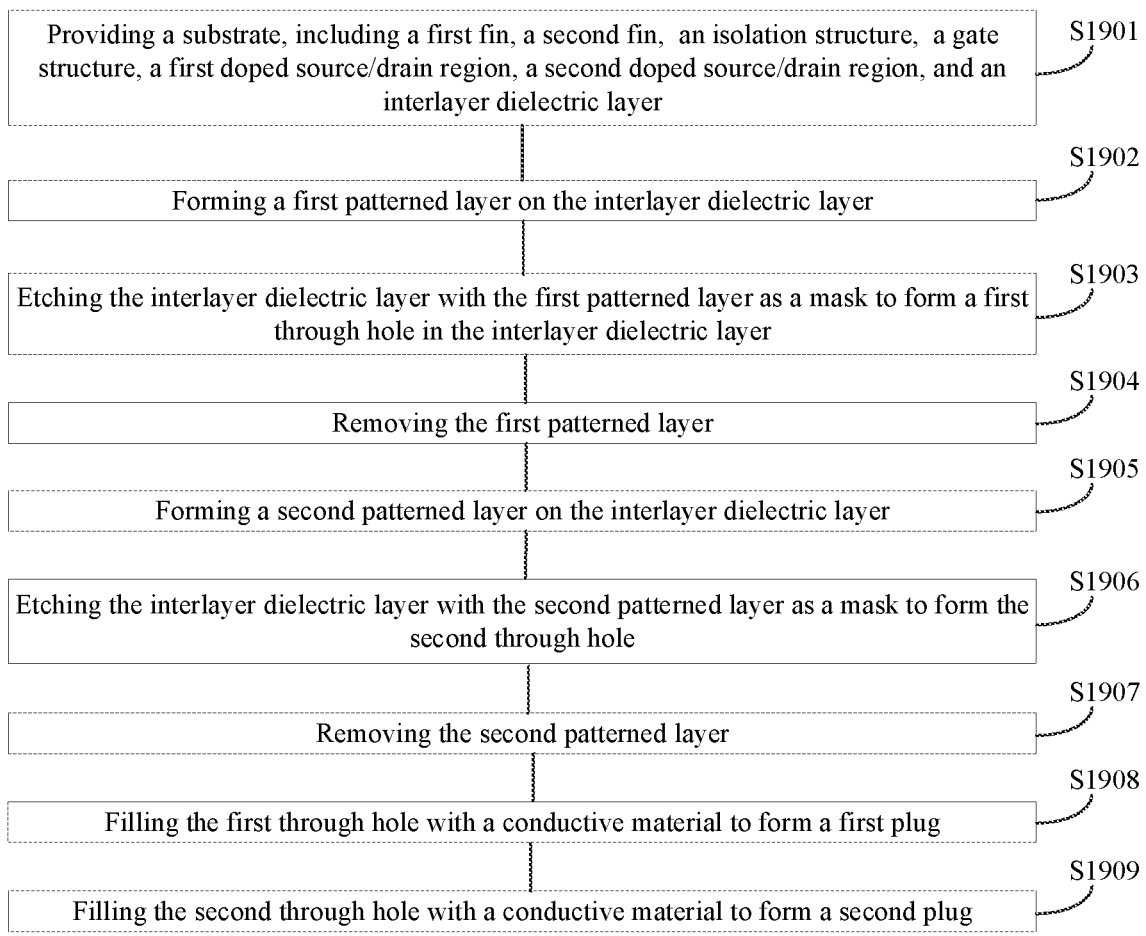
FIG. 19 illustrates a flowchart of an exemplary method for forming a semiconductor device consistent with various disclosed embodiments in the present disclosure.

The present disclosure provides a semiconductor device and a forming method of a semiconductor device. FIG. 19 illustrates a flowchart of an exemplary method for forming a semiconductor device consistent with various disclosed embodiments in the present disclosure. FIGS. 2-18 illustrate schematic diagrams of semiconductor structures at certain stages during a fabrication process of an exemplary semiconductor device consistent with the disclosed embodiments in the present disclosure. The method includes forming a first through hole exposing the surface of the first doped source/drain region or the second doped source/drain region in the interlayer dielectric layer; forming a second through hole in the interlayer dielectric layer on the isolation structure, and the second through hole communicates with the first through hole; after forming the first through hole and the second through hole, filling the first through hole with a conductive material to form a first plug, and filling the second through hole with a conductive material to form a second plug. The semiconductor device formed by the method has better performance.

For making the above objects, features and advantages of the present invention more understandable, the specific embodiments of the present disclosure are described in detail below with reference to the accompanying drawings.

Figure 2:
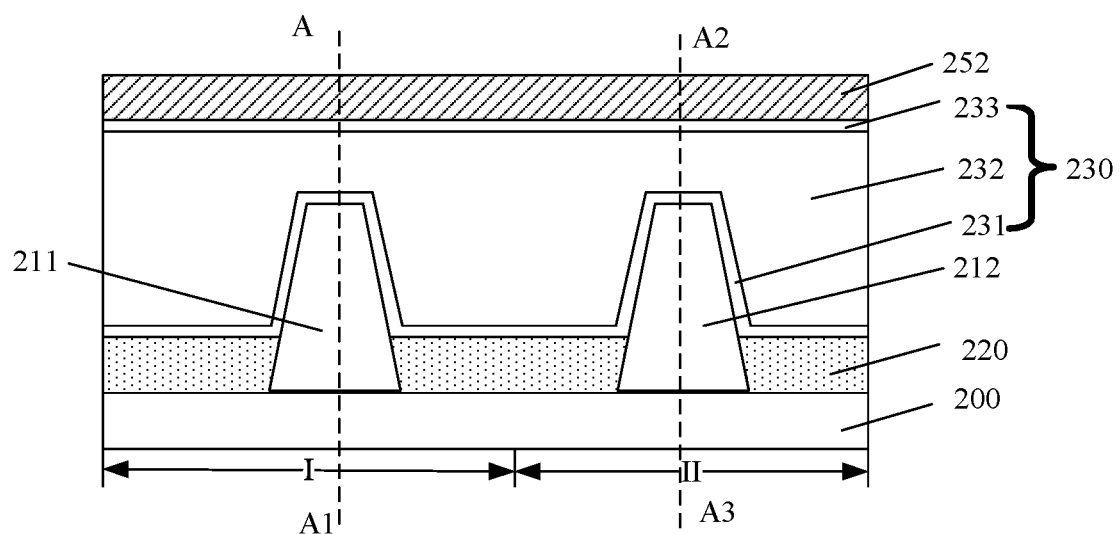
FIGS. 2-18 illustrate schematic diagrams of semiconductor structures at certain stages during a fabrication process of an exemplary semiconductor device consistent with various disclosed embodiments in the present disclosure.
Figure 3:
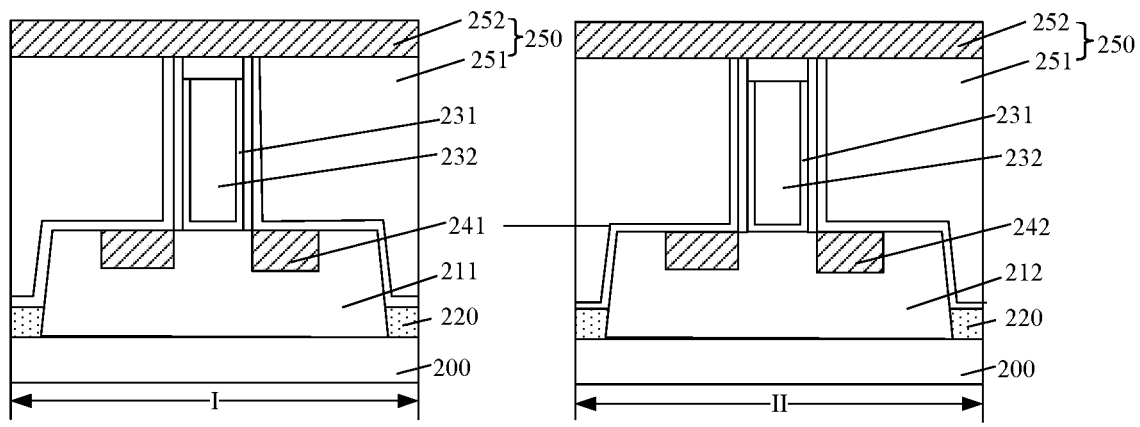

Referring to FIG. 19, at the beginning of the fabrication process, a substrate is provided (S1901). FIG. 2 illustrates a corresponding structure. FIG. 3 illustrates a schematic diagram of the structure in FIG. 2 along A-A1 direction and along A2-A3 direction. A first fin 211 and a second fin 212 adjacent and arranged in parallel are on a substrate 200. An isolation structure 220 and a gate structure 230 are on the substrate 200. The isolation structure 220 covers part of sidewalls of the first fin 211 and the second fin 212. The gate structure 230 straddles the first fin 211 or the second fin 212. The gate structure 230 covers part of the isolation structure 220. A first doped source/drain region 241 is in the first fin 211 on both sides of the gate structure 230. A second doped source/drain region 242 is in the second fin 212 on both sides of the gate structure 230. An interlayer dielectric layer 250 is on the isolation structure 220. The interlayer dielectric layer 250 covers the tops and sidewalls of the first fin 211 and the second fin 212 and covers the top and sidewalls of the gate structure 230.

In one embodiment, a material of the substrate 200 is single crystal silicon. The substrate may also be polysilicon or amorphous silicon. The material of the substrate may also be a semiconductor material such as germanium, silicon germanium or gallium arsenide. The substrate can also be a semiconductor-on-insulator structure. The semiconductor-on-insulator structure includes an insulator and a layer of semiconductor material on the insulator. The materials of the semiconductor material layer include a semiconductor material such as silicon, germanium, silicon germanium, gallium arsenide or indium gallium arsenide.

In one embodiment, a material of the isolation structure 220 is silicon oxide. In other embodiments, the material of the isolation structure may also be silicon oxynitride.

The isolation structure 220 is used to provide electrical insulation between different semiconductor devices.

In one embodiment, the interlayer dielectric layer 250 includes a first dielectric layer 251 and a second dielectric layer 252 on the surface of the first dielectric layer 251. The first dielectric layer 251 may cover the surface of the isolation structure 220, cover the tops and sidewalls of the first fin 211 and the second fin 212, and cover sidewalls of the gate structure 230. The top surface of the first dielectric layer 251 is flush with the top surface of the gate structure 230.

A material of the first dielectric layer 251 includes silicon oxide, silicon nitride, silicon oxynitride, silicon borohydride, silicon oxynitride or silicon oxynitride. A material of the second dielectric layer 252 includes silicon oxide, silicon nitride, silicon oxynitride, silicon borohydride, silicon oxynitride or silicon oxynitride.

In one embodiment, the first dielectric layer 251 and the second dielectric layer 252 have a same material and are all silicon oxide. In other embodiments, the materials of the first dielectric layer and the second dielectric layer are different.

In one embodiment, the gate structure 230 covers part of top surfaces and sidewall surfaces of the first fin 211 and the second fin 212. The gate structure 230 includes a gate dielectric layer 231 on part of top surfaces and sidewall surfaces of the first fin 211 and the second fin 212, a gate electrode layer 232 on a surface of the gate dielectric layer 231, and a mask layer 233 on a surface of gate dielectric layer 231 and the gate electrode layer 232.

A material of the gate dielectric layer 231 includes a high-k dielectric material (K is greater than or equal to 3.9), such as $HfO_2$, $La_2O_3$, HfSiON, $HfAlO_2$, $ZrO_2$, $Al_2O_3$ or $HfSiO_4$.

A material of the gate electrode layer 232 includes Al, Cu, Ag, Au, Ni, Ti, W, WN or WSi.

A material of the mask layer 233 includes titanium nitride or silicon nitride.

In one embodiment, the sidewall surface of the gate structure 230 further has a sidewall structure (not shown). On the one hand, the sidewall structure is used to decide positions of the first doped source/drain region 241 and the second doped source/drain region 242. On the other hand, the sidewall structure is used to protect sidewalls of the gate structure 230 from etch damage of the subsequent etching process and energy damage of the ion implantation process.

The first through hole exposing the surface of the first doped source/drain region 241 or the second doped source/drain region 242 is formed in the interlayer dielectric layer 250. The forming process of the first through hole is described in detail with reference to the FIGS. 4-8.

Figure 4:
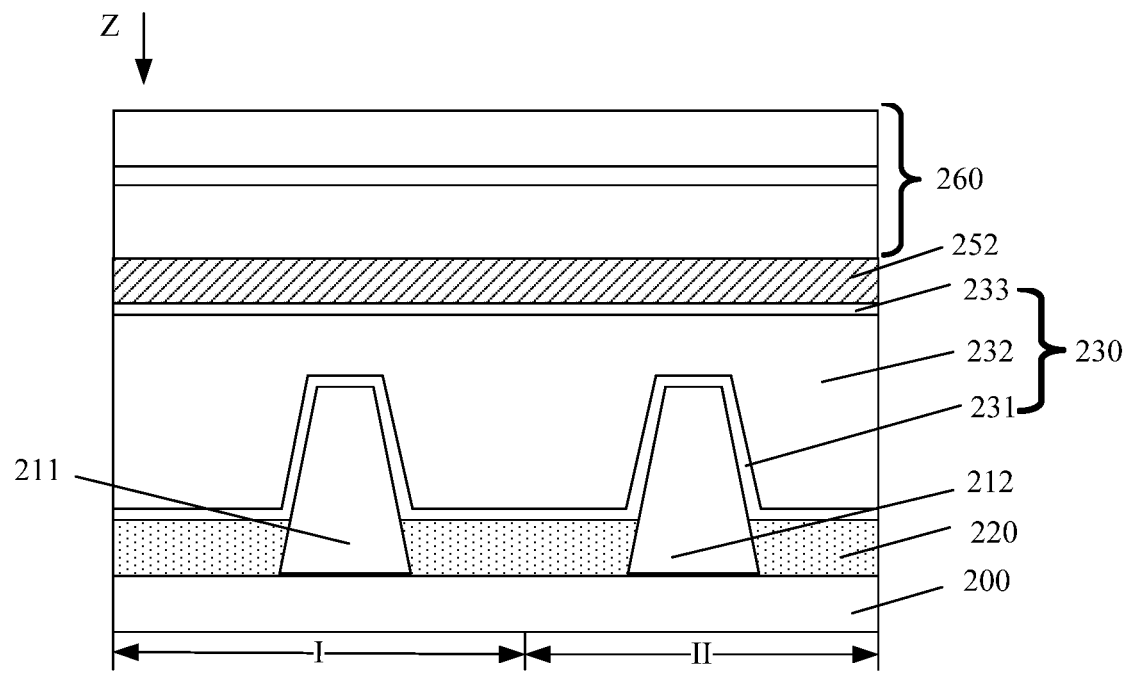
Figure 5:
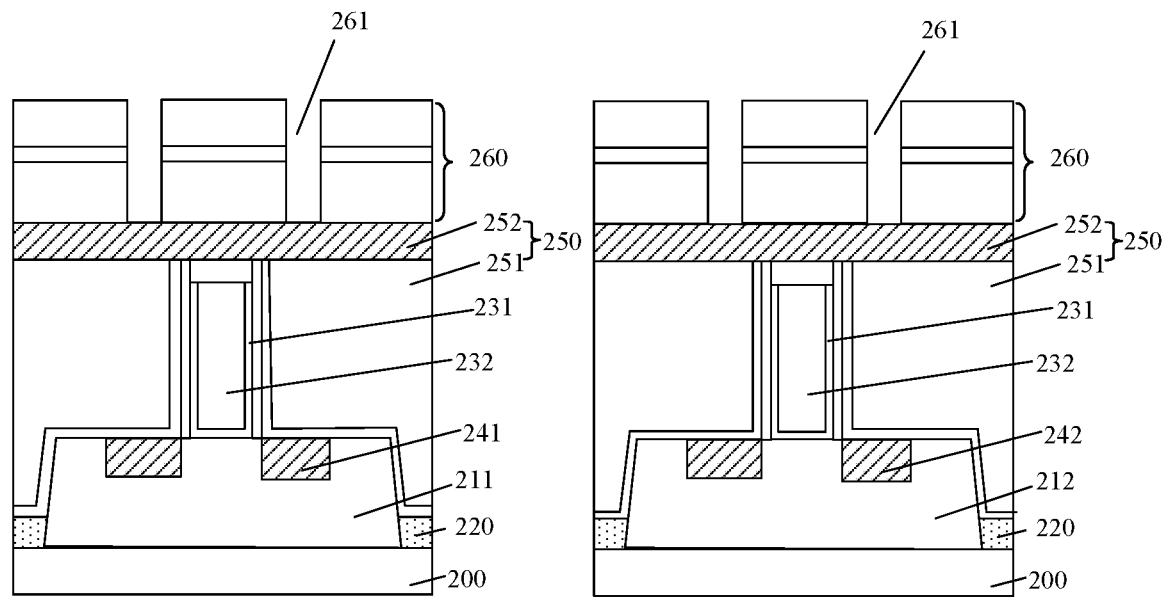
Figure 6:
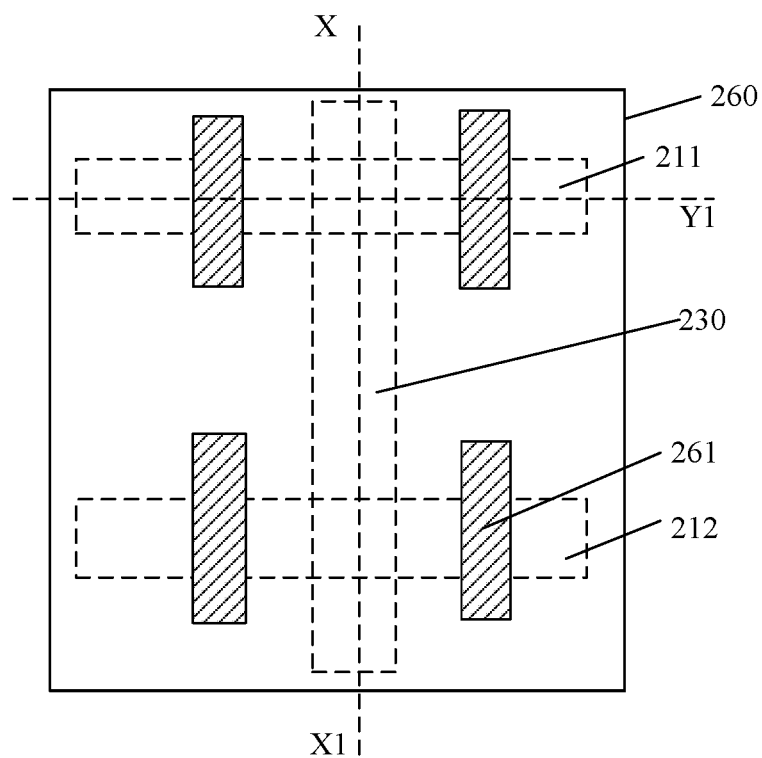

Further, returning to FIG. 19, a first patterned layer on the interlayer dielectric layer is formed (S1902). FIG. 4 illustrates a schematic diagram on the basis of FIG. 2. FIG. 5 illustrates a schematic diagram on the basis of FIG. 3. FIG. 6 illustrates a top view of the structure shown in FIG. 4 in Z direction, and FIG. 4 illustrates a schematic view of the structure in FIG. 6 along X-X1 direction. FIG. 5 illustrates the schematic diagram of the structure in FIG. 6 along Y-Y1 direction. The first patterned layer 260 is formed on the interlayer dielectric layer 250. The first patterned layer 260 has a plurality of first openings 261. The plurality of first openings 261 are on the first doped source/drain region 241 or the second doped source/drain region 242.

The first patterned layer 260 includes a first patterned photoresist layer (not shown) on the interlayer dielectric layer 250. The first photoresist layer exposes the surface of the interlayer dielectric layer 250 on the first doped source/drain region 241 and the second doped source/drain region 242.

In one embodiment, the first patterned layer 260 further includes a first bottom anti-reflection layer (not shown) at a bottom of the first photoresist layer, a first planarization layer at a bottom of the first bottom anti-reflection layer (not shown). The first planarization layer is on the surface of the interlayer dielectric layer 250.

Forming the first patterned layer 260 includes: forming a first planarization material layer (not shown) on the surface of the interlayer dielectric layer 250; forming a first bottom anti-reflection material layer on the surface of the first planarization material layer (not shown); forming a first patterned photoresist layer (not shown) on the surface of the first bottom anti-reflection material layer; and with the first patterned photoresist layer as a mask, etching the first bottom anti-reflection material layer and the first planarization material layer until the surface of the interlayer dielectric layer 250 is exposed to form the first patterned layer 260 having the plurality of first openings 261.

The first patterned layer 260 is used to provide a mask for subsequently forming a first through hole in the interlayer dielectric layer 250. Since the first opening 261 in the first patterned layer 260 is on the first doped source/drain region 241 or the second doped source/drain region 242, the first through hole formed in the interlayer dielectric layer 250 with the first patterned layer 260 as a mask is on the top surface of the first doped source/drain region 241 or the second doped source/drain region 242.

Figure 7:
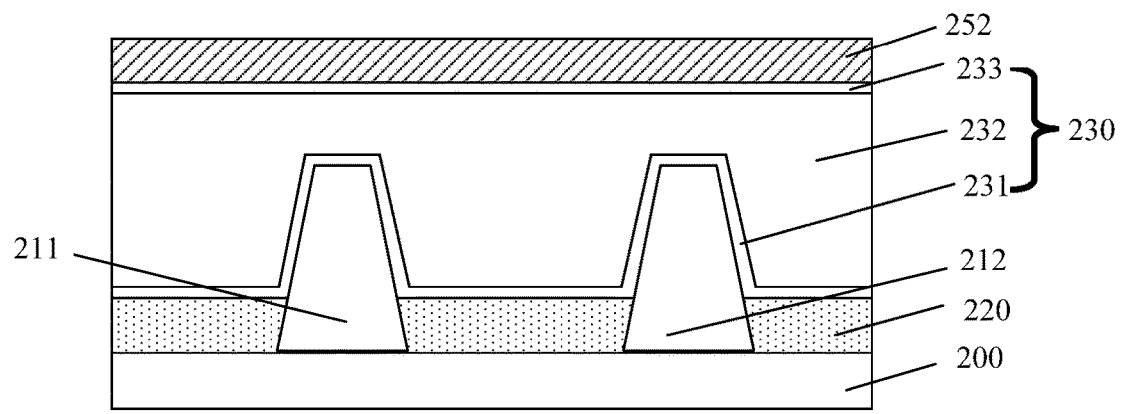
Figure 8:
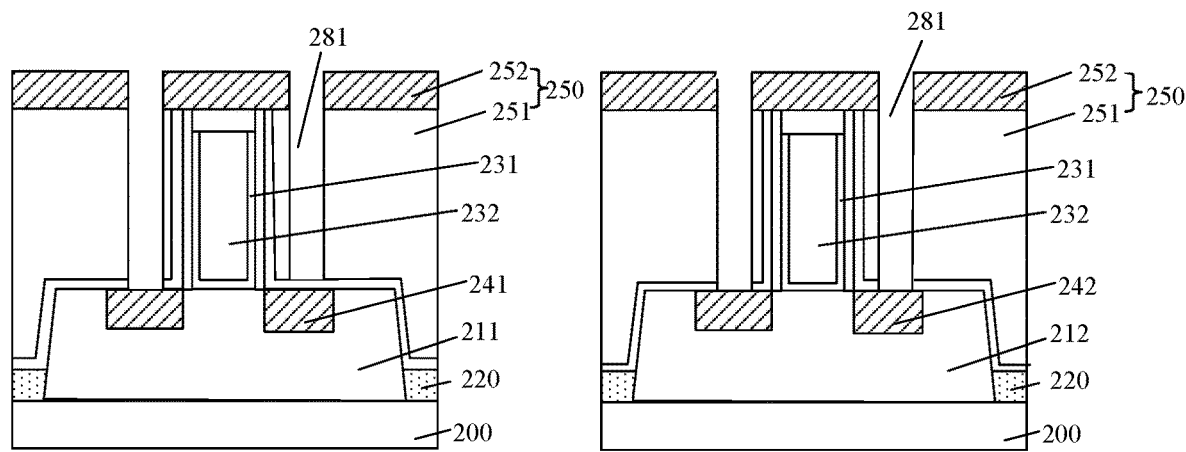

Further, referring to FIG. 19, the interlayer dielectric layer is etched with the first patterned layer as a mask to form a first through hole in the interlayer (S1903). FIG. 7 illustrates a schematic diagram on the basis of FIG. 4 and FIG. 8 illustrate a schematic diagram on the basis of FIG. 5. With the first patterned layer 260 as a mask, the interlayer dielectric layer 250 is etched until the top surface of the first doped source/drain region 241 and the second doped source/drain region 242 are exposed. A first through hole 281 is formed in the interlayer dielectric layer 250.

The position and size of the first through hole 281 are determined by the first opening 261 in the first patterned layer 260. Since the first opening 261 is above the first doped source/drain region 241 or the second doped source/drain region 242, the etched first through hole 281 can expose the first doped source/drain region 241 or the second doped source/drain region 242. The first plug formed in the first through hole 281 is in surface contact with the first doped source/drain region 241 or the second doped source/drain region 242, such that the first plug can electrically connect the first doped source/drain region 241 or the second doped source/drain region 242 to the peripheral circuit.

A distance between the adjacent first through holes 281 in an extending direction of the gate structure 230 is between 70 nm and 150 nm.

The significance of selecting the range of the distance is that, if the distance is greater than 150 nm, the adjacent first through hole 281 formed in the extending direction of the gate structure 230 requires a large size, thereby correspondingly increasing the area of the substrate 200 for forming the semiconductor device, resulting in a decrease in integration and poor performance of the formed semiconductor device. If the distance is less than 70 nm, the adjacent first through holes 281 whose distance is too small are formed in the extending direction of the gate structure 230, thereby exceeding the physical limit of the existing single photolithography process. The etching accuracy is not high, and the short circuit is easily generated between the plugs formed on the surfaces of the first doped source/drain region 241 and the second doped source/drain region 242, resulting in device failure and poor performance of the formed semiconductor device.

With the first patterned layer 260 as a mask, an etching process for etching the interlayer dielectric layer 250 includes one of a dry etching process and a wet etching process or a combination thereof.

Further, returning to FIG. 19, the first patterned layer is removed (S1904). After forming the first through hole 281 and before subsequently forming the second patterned layer, forming the semiconductor device further includes removing the first patterned layer 260.

With the second patterned layer as a mask, the interlayer dielectric layer is etched to form a second through hole. The second through hole is formed on the interlayer dielectric layer 250 on the isolation structure 220. The second through hole is connected to the first through hole are. The forming process of the second through hole is described in detail with reference to FIGS. 9-18.

Figure 9:
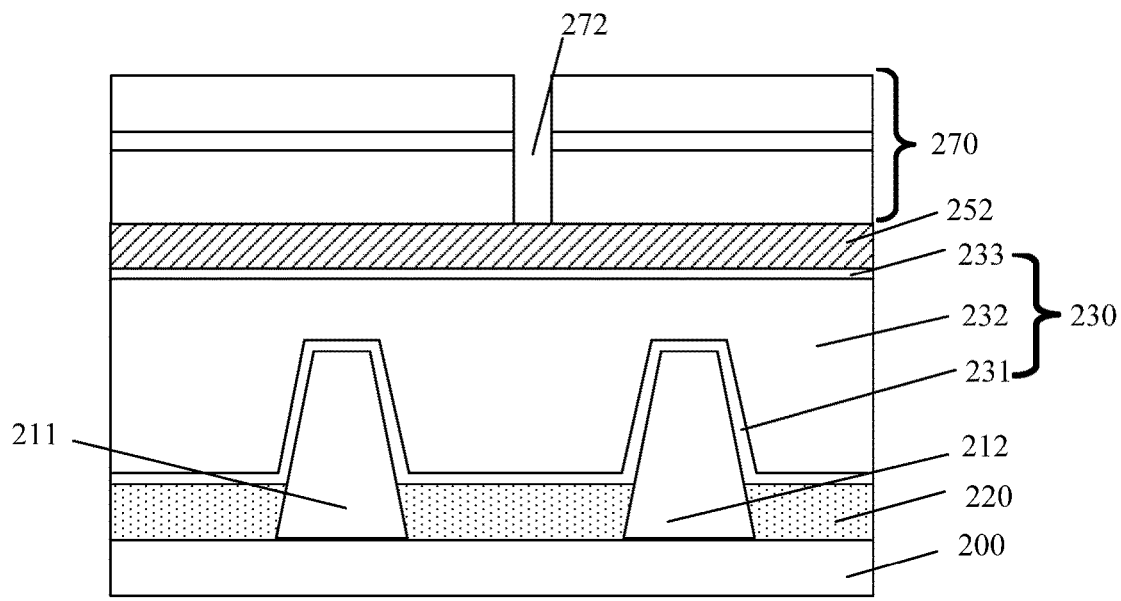
Figure 10:
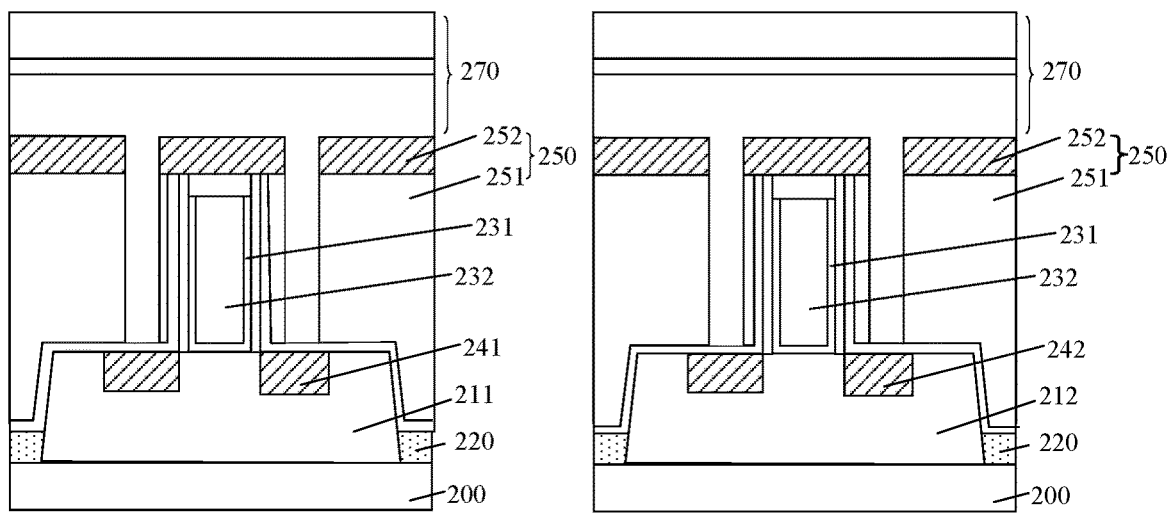
Figure 11:
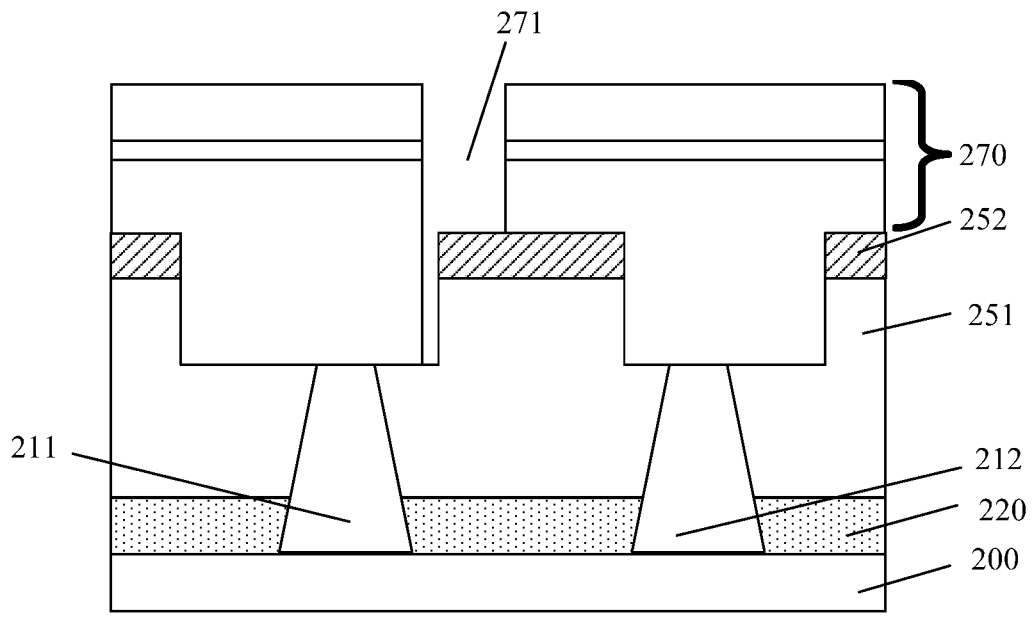
Figure 12:
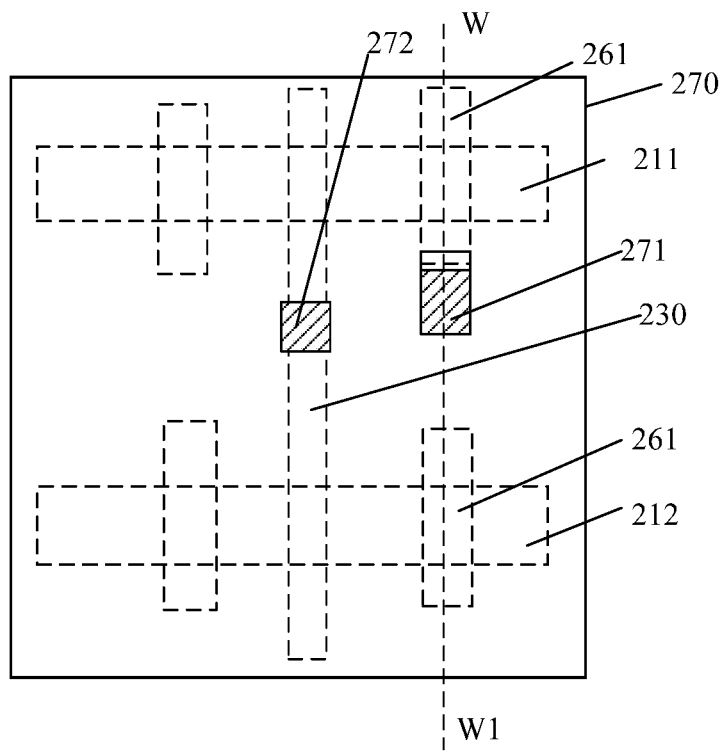

Further, referring to FIG. 19, a second patterned layer on the interlayer dielectric layer is formed (S1905). FIG. 9 illustrates a schematic diagram on the basis of FIG. 7. FIG. 10 is a schematic diagram on the basis of FIG. 8. FIG. 11 illustrates a schematic diagram of the structure shown in FIG. 12 along W-W1 direction. FIG. 12 and FIG. 6 are in a same view direction. After the first through hole 281 is formed, a second patterned layer 270 having a plurality of second openings 271 is formed on the interlayer dielectric layer 250. The projection pattern of the second opening 271 on the surface of the substrate 200 and the projection pattern of the first opening 261 on the surface of the substrate 200 partially overlap.

The second patterned layer 270 includes a second patterned photoresist layer (not shown) on the interlayer dielectric layer 250. The second photoresist layer exposes the surface of the interlayer dielectric layer 250 on part of the isolation structure 220.

In one embodiment, the second patterned layer 270 further includes a second bottom anti-reflection layer (not shown) at a bottom of the second photoresist layer, and a second planarization layer (not shown) at a bottom of the second bottom anti-reflection layer. The second planarization layer is on the surface of the interlayer dielectric layer 250.

Forming the second patterned layer 270 includes: forming a second planarization material layer (not shown) on the surface of the interlayer dielectric layer 250; forming a second bottom anti-reflection material layer on the surface of the second planarization material layer (not shown); forming a second patterned photoresist layer (not shown) on the surface of the second bottom anti-reflection material layer; exposing and developing the second photoresist material layer to form the second patterned photoresist layer; and with the second patterned photoresist layer as a mask, etching the second bottom anti-reflection material layer and the second planarization material layer until the surface of the interlayer dielectric layer 250 is exposed to form the second patterned layer 270 having a plurality of second openings 271.

The second patterned layer 270 is used as a mask for subsequently forming the second through hole in the interlayer dielectric layer 250.

Since the projection pattern of the second opening 271 on the surface of the substrate 200 and the projection pattern of the first opening 261 on the surface of the substrate 200 partially overlap, the subsequently formed second through hole and the first through hole can communicate.

In one embodiment, the second opening 271 is not on the gate structure 230. With the second patterned layer 270 as a mask, the second through hole formed in the interlayer dielectric layer 250 is not on the top surface of the gate structure 230. In other embodiments, the second opening is on the gate structure, that is, the projection pattern of the second opening on the surface of the substrate not only overlaps the projection pattern of the first opening on the surface of the substrate, but also is on the gate structure.

In one embodiment, the second patterned layer 270 further includes a third opening 272 on the gate structure 230.

Since the third opening 272 is on the gate structure 230, with the second patterned layer 270 as a mask, the third through hole subsequently formed in the interlayer dielectric layer 250 exposes the top surface of the gate structure 230.

Figure 13:
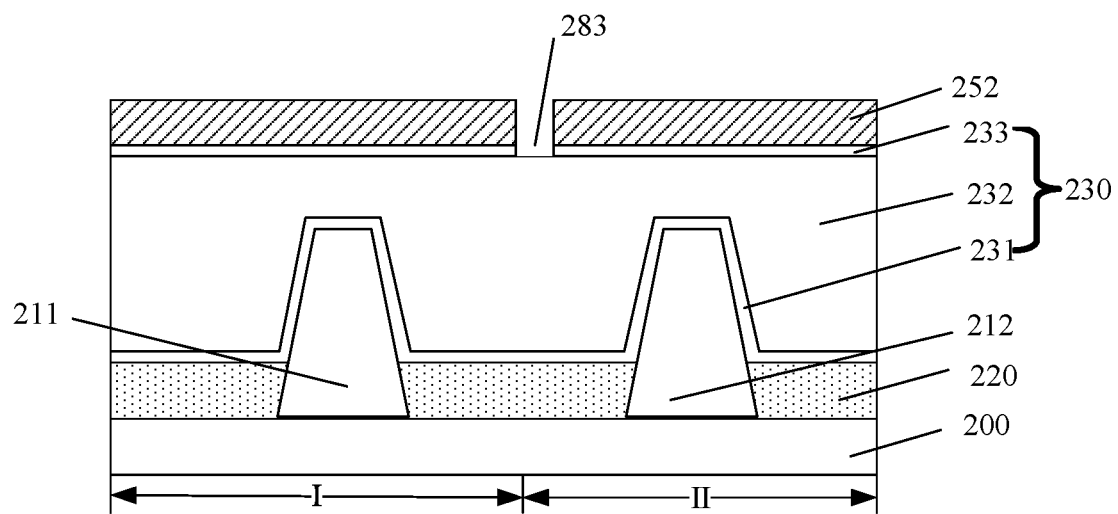
Figure 14:
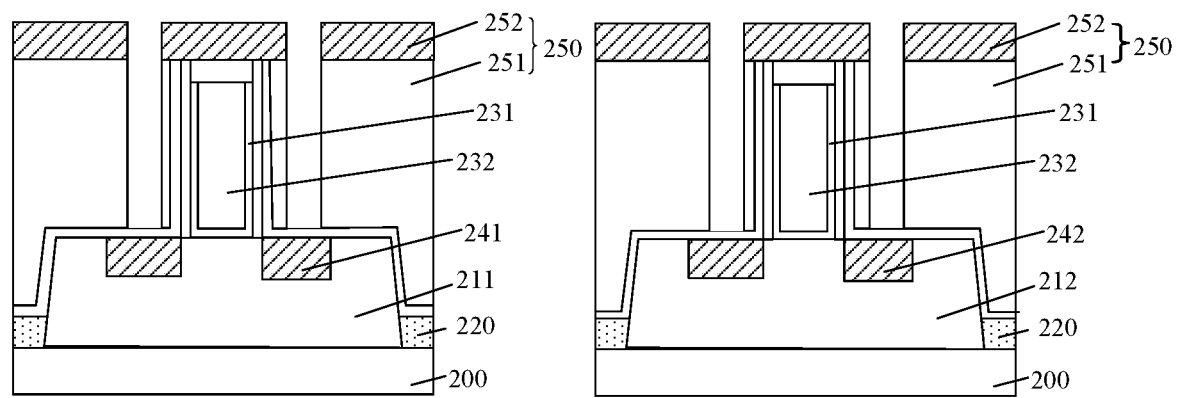
Figure 15:
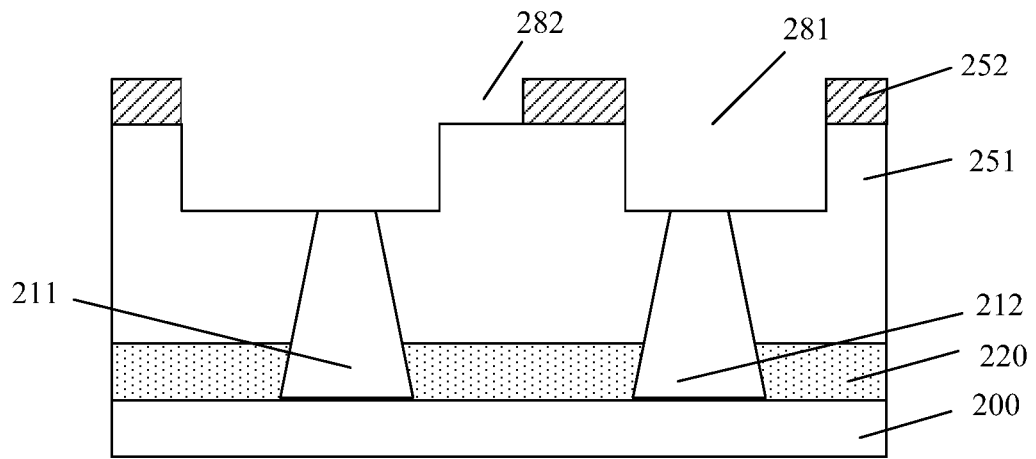

Further, returning to FIG. 19, with the second patterned layer as a mask, the interlayer dielectric layer is etched to form the second through hole (S1906). FIG. 13 illustrates a schematic diagram on the basis of FIG. 9. FIG. 14 illustrates a schematic diagram on the basis of FIG. 10. FIG. 15 illustrates a schematic diagram on the basis of FIG. 11. With the second patterned layer 270 as a mask, the interlayer dielectric layer 250 is etched. The second through hole 282 corresponding to the position of the second opening 271 is formed in the interlayer dielectric layer 250. In one embodiment, forming a semiconductor device further includes: with the second patterned layer 270 as a mask, etching the interlayer dielectric layer 250 to expose the top surface of the gate structure 230, and forming a third through hole 283 corresponding to the position of the third opening 272 in the interlayer dielectric layer 250.

The second through hole 282 is used to subsequently fill a conductive material to form a second plug. The third through hole 283 is used to subsequently fill a conductive material to form a third plug.

The position and size of the second through hole 282 are determined by the second opening 271 in the second patterned layer 270. Since the projection pattern of the second opening 271 on the surface of the substrate 200 and the projection pattern of the first opening 261 on the surface of the substrate 200 partially overlap, the second through hole 282 formed with the second patterned layer 270 as a mask is connected to the first through hole 281 formed with the first patterned layer 260 as a mask. A first plug formed in the first through hole 281 is subsequently connected to a second plug formed in the second through hole 282.

The position and size of the third through hole 283 are determined by the third opening 272 in the second patterned layer 270. Since the third opening 272 is above the gate structure 230, the etched third through hole 283 can expose the gate structure 230. The third plug formed in the third through hole 283 is subsequently in surface contact with the gate structure 230, so that the third plug can electrically connect the gate structure 230 and the peripheral circuit.

With the second patterned layer 270 as a mask, the second through hole 282 is formed by etching. With the second patterned layer 270 as a mask, the third through hole 283 is formed by etching. That is, the second through hole 282 and the third through hole 283 are formed by a same patterned layer and a same etching process, thereby saving the number of patterned layers, reducing the number of process steps, making the process steps for forming a semiconductor device simple, and saving the production cost.

Further, referring to FIG. 19, the second patterned layer is removed (S1907). In one embodiment, after the second through hole 282 and the third through hole 283 are formed, and before the first plug, the second plug, and the third plug are subsequently formed, forming a semiconductor device further includes removing the second patterned layer 270.

Figure 16:
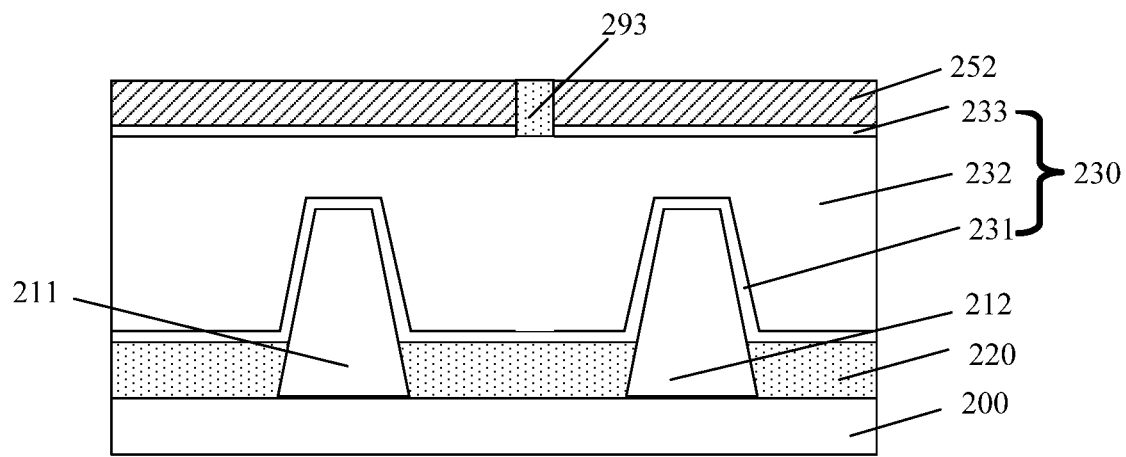
Figure 17:
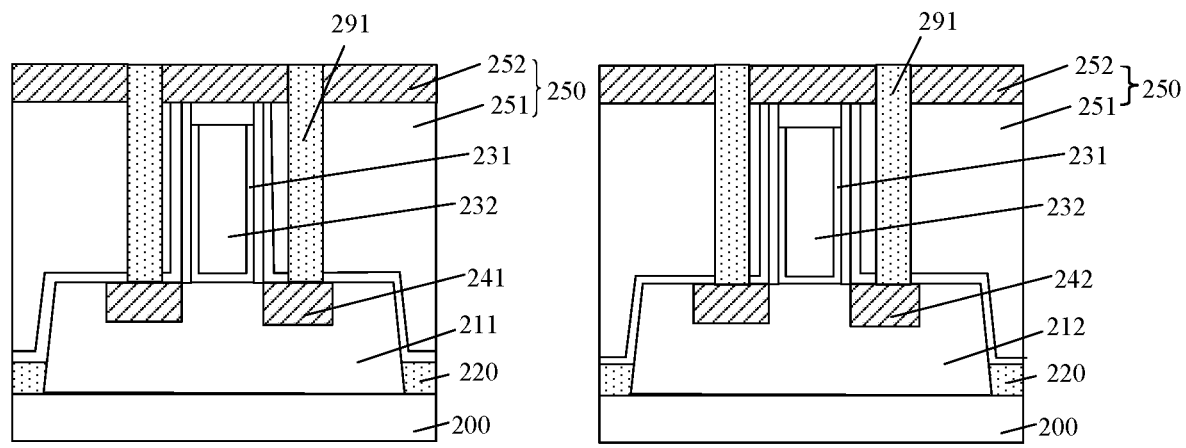

Further, returning to FIG. 19, the first through hole is filled with a conductive material to form a first plug (S1908), and the second through hole is filled with a conductive material to form a second plug (S1909). FIG. 16 illustrates a schematic view on the basis of FIG. 13. FIG. 17 illustrates a schematic view on the basis of FIG. 14. FIG. 18 illustrates a schematic view on the basis of FIG. 15. After the second through hole 282 is formed, a first plug 291 is formed in the first through hole 281, and a second plug 292 is formed in the second through hole 282.

In one embodiment, forming a semiconductor device further includes forming a third plug 293 in the third through hole 283.

The first plug 291, the second plug 292 and the third plug 293 may be simultaneously formed. Or after the first plug 291 is formed, the second plug 292 and the third plug 293 are formed. Or before the first plug 291 is formed, the second plug 292 and the third plug 293 are formed.

In one embodiment, the first plug 291, the second plug 292 and the third plug 293 are simultaneously formed. Forming the first plug 291, the second plug 292 and the third plug 293 includes: forming a conductive material film (not shown) at the bottoms and on sidewalls of the first through hole 281, the second through hole 282, and the third through hole 283, and on the surface of the interlayer dielectric layer 250, and filling the first through hole 281, the second through hole 282 and the third through hole 283 with the conductive material film; planarizing the conductive material film until the top surface of the interlayer dielectric layer 250 is exposed to form the first plug 291 in the first through hole 281, form a second plug 292 in the second through hole 282, and form a third plug 293 in the third through hole 283.

A material of the first plug 191 includes Al, Cu, Ag, Au, Ni, Ti, W, WN or WSi. A material of the second plug 192 includes Al, Cu, Ag, Au, Ni, Ti, W, WN or WSi. A material of the third plug 193 includes Al, Cu, Ag, Au, Ni, Ti, W, WN or WSi.

In one embodiment, the materials for the first plug 191, the second plug 192 and the third plug 193 are the same, W.

Planarizing the conductive material film includes a chemical mechanical polishing process.

The first plug 291 is on the top surface of the first doped source/drain region 241 or the second doped source/drain region 242. The first plug 291 is used to electrically connect the first doped source/drain region 241 and the second doped source/drain region 242 to the peripheral circuit respectively. The third plug 293 on the top surface of the gate structure 230 is used to electrically connect the gate structure 230 to the peripheral circuit.

The second through hole 282 formed with the second patterned layer 270 as a mask is connected to the first through hole 281 formed with the first patterned layer 260 as a mask. The first plug 291 formed in the first through hole 281 is connected to the second plug 292 formed in the second through hole 282, so that the second plug 292 can increase the size of first plug 291 in the extending direction of the gate structure 230. If a distance between adjacent first plugs 291 on the first doped source/drain region 241 and the second doped source/drain region 242 is large in the extending direction of the gate structure 230, as the second plug 292 can increase the size of the first plug 291 in the extending direction of the gate structure 230, the distance between the adjacent plugs formed on the first doped source/drain region 241 and the second doped source/drain region 242 can still be small to satisfy the process requirements with high integration. The first plug 291 is formed with a large pitch, which reduces the difficulty of the existing photolithography process, thereby ensuring forming accuracy and avoiding short circuit of adjacent plugs on the first doped source/drain region 241 and the second doped source/drain region 242 to cause device failure.

In summary, the forming method of a semiconductor device described above enables the distance between adjacent plugs formed on the first doped source/drain region 241 and the second doped source/drain region 242 to be sufficiently small, and prevent short circuit to ensure better performance of the formed semiconductor device. It is not necessary to additionally increase the number of patterned layers and process steps, so that the process steps for forming a semiconductor device are simple, and the production cost is saved.

The present disclosure further provides a semiconductor device with reference to FIG. 18, the semiconductor device includes a substrate 200, a first fin 211 and a second fin 212 adjacent to each other and arranged in parallel on the substrate, an isolation structure 220 covering part of sidewalls of the first fin 211 or the second fin 212, a gate structure 230 across the first fin 211 or the second fin 212, the gate structure 230 covering part of the isolation structure 220, a first doped source/drain region 241 in the first fin 211 on both sides of the gate structure 230, a second doped source/drain region 242 in the second fin 212 on both sides of the gate structure 230, an interlayer dielectric layer 250 on the isolation structure 220 covering tops and sidewalls of the first fin 211 and the second fin 212, and covering top and sidewalls of the gate structure 230, a first through hole 281 in the interlayer dielectric layer 250 exposing the surface of the first doped source/drain region 241 or the second doped source/drain region 242, and the first plug 291 in the first through hole 281; and a second through hole 282 in the interlayer dielectric layer 250 on the isolation structure 220, and a second plug 292 in the second through hole 282, the second through hole 292 being connected to the first through hole 291.

The semiconductor device further includes a third through hole 283 in the interlayer dielectric layer 250, and a third plug 293 in the third through hole 283. The third plug 293 is on the top surface of the gate structure 230.

In one embodiment, the interlayer dielectric layer 250 includes a first dielectric layer 251 covering the surface of the isolation structure 220, covering tops and sidewalls of the first fin 211 and covering the second fin 212, and sidewalls of the gate structure 230, and a second dielectric layer 252 on the surface of the first dielectric layer 251. The top surface of the first dielectric layer 251 is flush with the top surface of the gate structure 230.

A material of the first dielectric layer 241 includes silicon oxide, silicon nitride, silicon oxynitride, silicon borohydride, silicon oxynitride or silicon oxynitride. A material of the second dielectric layer 252 includes silicon oxide, silicon nitride, silicon oxynitride, silicon borohydride, silicon oxynitride or silicon oxynitride.

A material of each of the first plug 291 and the second plug 292 includes Al, Cu, Ag, Au, Ni, Ti, W, WN or WSi.

A distance between adjacent first through holes 281 in an extending direction of the gate structure 230 is between 70 nm and 150 nm.

Compared with the prior art, the technical solution of the present invention has the following beneficial effects.

In the method of forming a semiconductor device according to the present disclosure, since the first through hole is connected to the second through hole, the first plug formed in the first through hole and the second formed in the second through hole can communicate, and the second plug can increase the size of the first plug in the extending direction of the gate structure. If a distance between the first doped source/drain region and the second doped source/drain region surface adjacent to the first plug is large in the extending direction of the gate structure, since the second plug can increase the size of the first plug in the extending direction of the gate structure, the distance between the adjacent plugs can still be small to satisfy the process requirements with high integration degree. A large pitch formed in adjacent first plugs reduces the difficulty of the existing photolithography process, thereby ensuring accuracy and avoiding short circuit of adjacent plugs on the first doped source/drain region and the second doped source/drain region to cause device failure. It is not necessary to additionally increase the number of patterned layers and process steps to form the second through hole and the second plug located in the second through hole. In summary, the method enables the adjacent plugs formed on the surfaces of the first doped source/drain region and the second doped source/drain region to be sufficiently small while preventing short circuit to ensure better performance of the formed semiconductor device. It is not necessary to additionally increase the number of patterned layers and process steps, so that the process steps for forming a semiconductor device are simple, and the production cost is saved.

Further, the second patterned layer has a plurality of second openings therein, and the projection pattern of the second opening on the surface of the substrate and the projection pattern of the first opening on the surface of the substrate partially overlap, so that the second through hole formed with the second patterned layer as a mask and the first through hole formed with the first patterned layer as a mask can communicate. The second plug formed in the second through hole communicates with the first plug formed in the first through hole, so that the second plug can increase the size of the first plug in the extending direction of the gate structure.

Although the present disclosure has been disclosed above, the present disclosure is not limited thereto. Any changes and modifications can be made by those skilled in the art without departing from the spirit and scope of the invention, and the protection scope of the invention should be determined by the scope defined by the claims.

What is claimed is:

1. A method of forming a semiconductor device, comprising:
providing a substrate, a first fin and a second fin that are adjacent to each other and arranged in parallel on the substrate, an isolation structure covering a portion of sidewalls of the first and second fins, a gate structure across the first fin or the second fin, the gate structure covering a portion of the isolation structure, a first doped source/drain region in the first fin on both sides of the gate structure, a second doped source/drain region in the second fin on both sides of the gate structure, and an interlayer dielectric layer on the isolation structure, covering tops and sidewalls of the first and second fins, and covering top and sidewalls of the gate structure;
forming a first through hole in the interlayer dielectric layer and exposing the first doped source/drain region or the second doped source/drain region;
forming a second through hole in the interlayer dielectric layer on the isolation structure, wherein the second through hole is connected to the first through hole; and
forming a first plug in the first through hole and forming a second plug in the second through hole, after the first through hole and the second through hole are formed.

2. The method according to claim 1, wherein forming the first through hole comprises:
forming a first patterned layer on the interlayer dielectric layer, wherein the first patterned layer has a plurality of first openings on the first doped source/drain region or the second doped source/drain region; and
with the first patterned layer as a mask, etching the interlayer dielectric layer until top surfaces of the first doped source/drain region and the doped second source/drain region are exposed, to form the first through hole in the interlayer dielectric layer.

3. The method according to claim 2, wherein the first patterned layer comprises:
a first patterned photoresist layer on the interlayer dielectric layer, exposing the interlayer dielectric layer on the first doped source/drain region and the second doped source/drain region.

4. The method according to claim 3, wherein:
the first patterned layer further comprises:
a first bottom anti-reflection layer at a bottom of the first patterned photoresist layer; and
a first planarization layer at a bottom of the first bottom anti-reflection layer, wherein the first planarization layer is on the interlayer dielectric layer, and forming the first patterned layer comprises:
forming a first planarization material layer on the interlayer dielectric layer;
forming a first bottom anti-reflection material layer on the first planarization material layer;
forming a first photoresist material layer on the first bottom anti-reflection material layer;
exposing and developing the first photoresist material layer to form the first patterned photoresist layer; and
etching the first bottom anti-reflection material layer and the first planarization material layer with the first patterned photoresist layer as a mask until the interlayer dielectric layer is exposed, to form the first patterned layer having the plurality of first openings.

5. The method according to claim 1, wherein forming the second through hole comprises:
forming a second patterned layer on the interlayer dielectric layer, wherein the second patterned layer has a plurality of second openings, and a projection pattern of the second opening on a surface of the substrate and a projection pattern of the first opening on the surface of the substrate partially overlap; and
with the second patterned layer as a mask, etching the interlayer dielectric layer to form the second through hole corresponding to a position of the second opening in the interlayer dielectric layer.

6. The method according to claim 5, wherein the second patterned layer further includes a third opening on the gate structure, and the forming method further comprises:
with the second patterned layer as a mask, etching the interlayer dielectric layer until the top of the gate structure is exposed, to form a third through hole corresponding to a position of the third opening in the interlayer dielectric layer; and
filling the third through hole with a conductive material to form a third plug.

7. The method according to claim 5, wherein the second patterned layer comprises:
a second patterned photoresist layer on the interlayer dielectric layer, exposing a portion of the interlayer dielectric layer on the isolation structure.

8. The method according to claim 7, wherein:
the second patterned layer further comprises:
a second bottom anti-reflection layer at a bottom of the second photoresist layer;
a second planarization layer at a bottom of the second bottom anti-reflection layer, wherein the second planarization layer is on the interlayer dielectric layer, and forming the second patterned layer comprises:
forming a second planarization material layer on the interlayer dielectric layer;
forming a second bottom anti-reflection material layer on the second planarization material layer;
forming a second photoresist material layer on the second bottom anti-reflection material layer;
exposing and developing the second photoresist material layer to form the second patterned photoresist layer; and
etching the second bottom anti-reflection material layer and the second planarization material layer with the first patterned photoresist layer as a mask until the interlayer dielectric layer is exposed to form the second patterned layer having the plurality of second openings.

9. The method according to claim 1, wherein the interlayer dielectric layer comprises:
a first dielectric layer covering the isolation structure, covering tops and sidewalls of the first and second fins, covering a sidewall of the gate structure; and
a second dielectric layer on the first dielectric layer, wherein a top surface of the first dielectric layer is coplanar with a top surface of the gate structure.

10. The method according to claim 9, wherein:
a material of the first dielectric layer comprises silicon oxide, silicon nitride, silicon oxynitride, silicon borohydride, silicon oxynitride, silicon oxynitride, or a combination thereof; and
a material of the second dielectric layer comprises silicon oxide, silicon nitride, silicon oxynitride, silicon borohydride, silicon oxynitride, silicon oxynitride, or a combination thereof.

11. The method according to claim 9, wherein:
the first plug, the second plug and the third plug are simultaneously formed; or
the second plug and the third plug are formed after the first plug is formed; or
the second plug and the third plug are formed before the first plug is formed.

12. The method according to claim 11, wherein:
the first plug, the second plug and the third plug are simultaneously formed, and forming the first plug, the second plug the plug and the third plug comprises:
   forming a conductive material film on surfaces of a bottom and sidewalls of each of the first through hole, the second through hole, and the third through hole, and on the surface of the interlayer dielectric layer, wherein the conductive material film fills the first through hole, the second through hole and the third through hole; and
   planarizing the conductive material film until a top surface of the interlayer dielectric layer is exposed, to form the first plug in the first through hole, form the second plug in the second through hole, and form the third plug in the third through hole.

13. The method according to claim 1, wherein:
a material of each of the first plug and the second plug comprises Al, Cu, Ag, Au, Ni, Ti, W, WN or WSi.

14. The method according to claim 1, wherein:
a distance between adjacent first through holes in an extending direction of the gate structure is between 70 nm and 150 nm.

15. A semiconductor device, comprising:
a substrate, a first fin and a second fin adjacent to each other and arranged in parallel on the substrate, an isolation structure covering a portion of sidewalls of the first second fins, a gate structure across the first fin or the second fin, the gate structure covering a portion of the isolation structure, a first doped source/drain region disposed in the first fin on both sides of the gate structure, and a second doped source/drain region disposed in the second fin on both sides of the gate structure, and an interlayer dielectric layer on the isolation structure, covering tops and sidewalls of the first and second fins, and top and sidewalls of the gate structure,
a first through hole in the interlayer dielectric layer, exposing the first doped source/drain region or the second doped source/drain region, and a first plug in the first through hole, and
a second through hole in the interlayer dielectric layer on the isolation structure, and a second plug in the second through hole, wherein the second plug is connected to the first plug.

16. The semiconductor device according to claim 15, further comprising:
a third through hole in the interlayer dielectric layer; and
a third plug in the third through hole and on the gate structure.

17. The semiconductor device according to claim 15, wherein the interlayer dielectric layer comprises:
a first dielectric layer covering a surface of the isolation structure, covering tops and sidewalls of the first and second fins, covering a sidewall of the gate structure; and
a second dielectric layer on the first dielectric layer, wherein a top surface of the first dielectric layer is coplanar with a top surface of the gate structure.

18. The semiconductor device according to claim 17, wherein:
a material of the first dielectric layer comprises silicon oxide, silicon nitride, silicon oxynitride, silicon borohydride, silicon oxynitride, silicon oxynitride, or a combination thereof, and
a material of the second dielectric layer comprises silicon oxide, silicon nitride, silicon oxynitride, silicon borohydride, silicon oxynitride, silicon oxynitride, or a combination thereof.

19. The semiconductor device according to claim 15, wherein a material of each of the first plug and the second plug comprises Al, Cu, Ag, Au, Ni, Ti, W, WN or WSi.

20. The semiconductor device according to claim 15, wherein a distance between adjacent first through holes in an extending direction of the gate structure is between 70 nm and 150 nm.

* * * * *